(12) United States Patent
Sato

(10) Patent No.: US 10,573,592 B2
(45) Date of Patent: Feb. 25, 2020

(54) ASSEMBLIES HAVING SHIELD LINES OF AN UPPER WIRING LEVEL ELECTRICALLY COUPLED WITH SHIELD LINES OF A LOWER WIRING LEVEL

(71) Applicant: Micron Technology, Inc., Boise, ID (US)

(72) Inventor: Makoto Sato, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 136 days.

(21) Appl. No.: 15/663,774

(22) Filed: Jul. 30, 2017

(65) Prior Publication Data

US 2017/0352620 A1 Dec. 7, 2017

Related U.S. Application Data

(63) Continuation of application No. 15/155,334, filed on May 16, 2016, now Pat. No. 9,754,872.

(51) Int. Cl.
*H01L 23/528* (2006.01)
*H01L 23/522* (2006.01)

(52) U.S. Cl.
CPC ........ *H01L 23/5225* (2013.01); *H01L 23/528* (2013.01); *H01L 23/5226* (2013.01)

(58) Field of Classification Search
CPC .............. H01L 23/5225; H01L 23/528; H01L 23/5226; H01L 21/02606; H01L 21/4825; H01L 21/4853; H01L 21/4885; H01L 21/4889; H01L 21/67138; H01L 21/823475; H01L 21/823871; H01L 23/3733; H01L 23/52; H01L 23/5222; H01L 21/5223; H01L 23/05; H01L 23/5227; H01L 23/5228; H01L 24/42; H01L 24/44; H01L 24/46; H01L 2027/11875; H01L 27/124; H01L 27/3276;

(Continued)

(56) References Cited

U.S. PATENT DOCUMENTS 5,136,358 A 8/1992 Sakai
5,289,037 A 2/1994 Savignac
(Continued)

FOREIGN PATENT DOCUMENTS

WO WO 7/2017
PCT/US2017/024835
WO WO 11/2018
PCT/US2017/024835

*Primary Examiner* — Cuong B Nguyen
*Assistant Examiner* — Samuel Park
(74) *Attorney, Agent, or Firm* — Wells St. John P.S.

(57) ABSTRACT

Some embodiments include an assembly having a first wiring level with a plurality of first shield lines and first signal lines. The first shield lines and first signal lines have first segments extending along a first direction and second segments extending along the first direction and laterally offset from the first segments. The assembly includes a second wiring level below the first wiring level and having a plurality of second shield lines and second signal lines. The second shield lines and second signal lines have third segments extending along the first direction and fourth segments extending along the first direction and laterally offset from the third segments. The fourth segments of the second shield lines extend to under the first segments of the first shield lines and are electrically coupled to the first segments of the first shield lines through vertical interconnects.

18 Claims, 15 Drawing Sheets

(58) Field of Classification Search
CPC ............. H01L 27/3288; H01L 27/3297; H01L 2224/06139; H01L 2224/06149; H01L 2224/06159; H01L 2224/06169; H01L 2224/06189

See application file for complete search history.

(56) References Cited

U.S. PATENT DOCUMENTS

| | | |
|---|---|---|
| 6,510,545 B1 | 1/2003 | Yee |
| 6,522,011 B1 | 2/2003 | Farrar |
| 9,754,872 B1 | 9/2017 | Sato |
| 2001/0048163 A1 | 12/2001 | Kohno |
| 2002/0088977 A1* | 7/2002 | Mori ................. H01L 23/49822 257/68 |
| 2002/0127782 A1 | 9/2002 | Fukui |
| 2003/0020098 A1 | 1/2003 | Sasaki |
| 2004/0026716 A1 | 2/2004 | Ishimatsu et al. |
| 2005/0168618 A1 | 8/2005 | Okita |
| 2006/0220215 A1 | 10/2006 | Lee |
| 2007/0080436 A1 | 4/2007 | Chun et al. |
| 2007/0120261 A1 | 5/2007 | Ho et al. |
| 2008/0079161 A1 | 4/2008 | Kim |
| 2008/0083967 A1* | 4/2008 | Nakatani ............. H01L 23/5223 257/534 |
| 2009/0026503 A1 | 1/2009 | Tsuda |
| 2009/0237186 A1 | 9/2009 | Onda |
| 2010/0216284 A1 | 8/2010 | Nii |
| 2011/0214100 A1 | 9/2011 | Mcelvain |
| 2012/0127773 A1 | 5/2012 | Onda |
| 2012/0261831 A1 | 10/2012 | Sudo |
| 2014/0001639 A1 | 1/2014 | Hiraishi |
| 2018/0261539 A1 | 9/2018 | Sato et al. |

* cited by examiner (1) M3 : Signal
(2) M3 : VSS (1) M3 : Signal
(2) M3 : VSS
(3) M3 : VDD
(4) M3 : Signal

US 10,573,592 B2

ASSEMBLIES HAVING SHIELD LINES OF AN UPPER WIRING LEVEL ELECTRICALLY COUPLED WITH SHIELD LINES OF A LOWER WIRING LEVEL

RELATED PATENT DATA

This patent resulted from a continuation of U.S. patent application Ser. No. 15/155,334, which was filed May 16, 2016, and which is hereby incorporated herein by reference.

TECHNICAL FIELD

Assemblies having shield lines of an upper wiring level electrically coupled with shield lines of a lower wiring level.

BACKGROUND

Integrated circuitry may comprise multiple levels of stacked wiring. The levels may include signal lines alternately arranged with shield lines. The shield lines may be utilized to alleviate cross-talk between adjacent signal lines. An example configuration comprising three stacked wiring levels is shown in FIG. 1. Specifically, the configuration shows a first level of wiring M1, a second level of wiring M2, and a third level of wiring M3; with M3 being over M2 which in turn is over M1. Although three wiring levels are shown, it is to be understood that there may be other wiring levels below the illustrated levels and/or above the illustrated levels. Also, although the illustrated wiring levels are labeled M1-M3, if other wiring levels are present the shown levels may in fact be M2-M4; M3-M6; etc., depending on the number of wiring levels present beneath the illustrated wiring levels.

Each of the illustrated levels comprises signal lines alternately arranged with shield lines. It may be desired for the shield lines within one level to be electrically connected with shield lines at other levels above and below said one level. For instance, it may be desired for the shield lines within level M2 to be electrically connected with shield lines within level M1 and shield lines within level M3, as such may alleviate coupling noises between the vertically-stacked levels.

Connection of shield lines from level M2 with those of level M1 is relatively straightforward since the lines within level M1 run perpendicular to the lines within level M2. However, the connection of shield lines from level M2 with those of level M3 is problematic since the wiring within level M2 runs parallel to that within level M3, and the shield lines are staggered in level M2 relative to level M3. Thus there is no vertical overlap between the shield lines of level M2 with those of level M3.

It would be desirable to develop architectures which enable coupling between shield lines of stacked levels of the type illustrated as levels M2 and M3 in FIG. 1.

BRIEF DESCRIPTION OF THE DRAWINGS

FIG. 2 is a top view. FIGS. 2A-2C are diagrammatic cross-sectional views along the lines 2A-2A, 2B-2B and 2C-2C of FIG. 2, respectively.

FIG. 4 is a top view. FIG. 4A is a diagrammatic cross-sectional view along the line 4A-4A of FIG. 4.

DETAILED DESCRIPTION OF THE ILLUSTRATED EMBODIMENTS

Some embodiments include architectures in which the signal lines and shield lines within wiring layers are configured to have offset regions. Such offset regions may enable a vertical overlap to occur between shield lines of an upper wiring layer and shield lines of a lower wiring layer, even though the shield lines within both wiring layers run substantially parallel with one another, and even though the shield lines within the lower wiring layer are staggered relative to the shield lines within the upper wiring layer in a configuration analogous to that of FIG. 1. Example embodiments are described with reference to FIGS. 2-14.

Figure 2:
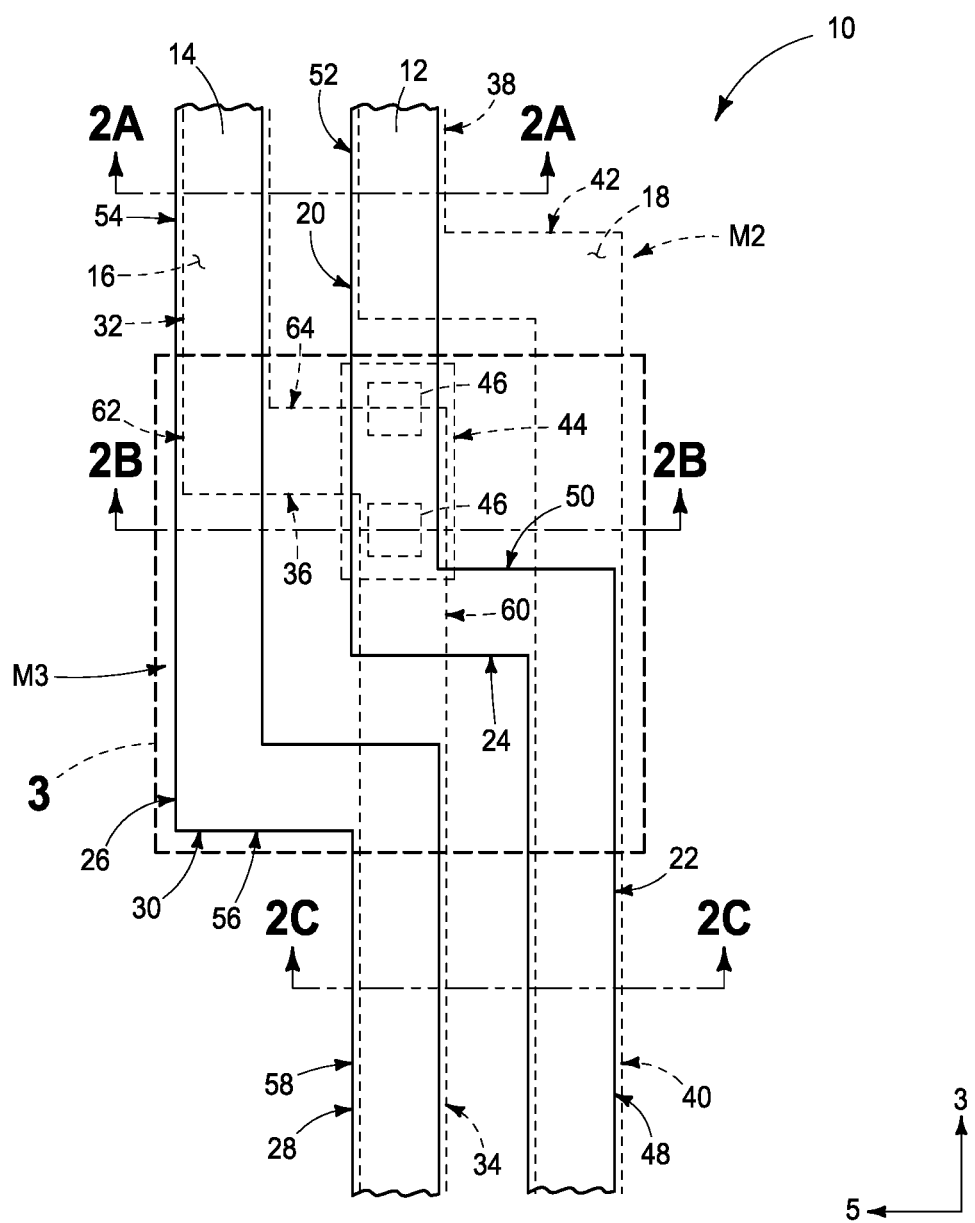
FIGS. 2-2C are diagrammatic views of an example embodiment arrangement of wiring levels.
Figure 2A:
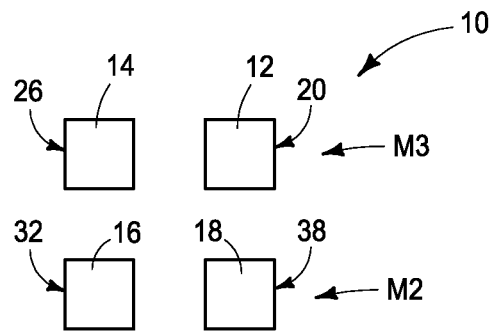
Figure 2B:
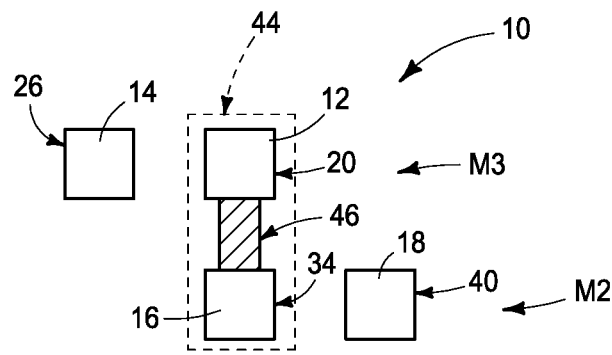
Figure 2C:
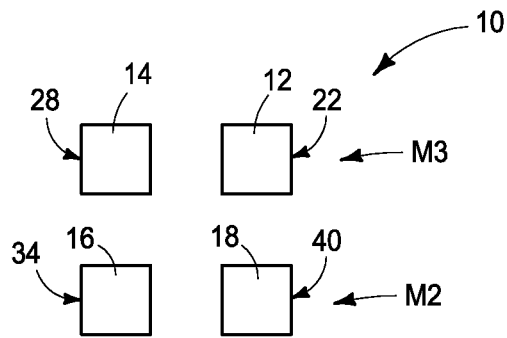

Referring to FIGS. 2-2C, a region of an integrated assembly 10 is illustrated. The assembly 10 includes a pair of vertically-stacked wiring levels M2 and M3. The level M2 is shown in dashed-line in the top-down view of FIG. 2 to indicate that such level is beneath the level M3.

Level M3 comprises a shield line 12 and a signal line 14 immediately adjacent the shield line. The lines 12 and 14 may be representative of a large plurality of shield lines and signal lines formed in alternating relationship within the wiring level M3.

Level M2 comprises a shield line 16 and a signal line 18 immediately adjacent the shield line. The lines 16 and 18 may be representative of a large plurality of shield lines and signal lines formed in alternating relationship within the wiring level M2.

In some embodiments the wiring level M3 may be referred to as a first wiring level, and the wiring level M2 may be referred to as a second wiring level beneath the first wiring level. The shield line 12 and signal line 14 within the first wiring level may be referred to as a first shield line and a first signal line, and such may be representative of a plurality of first shield lines and first signal lines formed in alternating arrangement across the first wiring level. Similarly, the shield line 16 and signal line 18 of the second wiring level be referred to as a second shield line and second signal line, and such may be representative of a plurality of second shield lines and second signal lines formed in alternating arrangement across the second wiring level.

The first shield line 12 has a first segment 20 and a second segment 22 laterally offset from the first segment. The first and second segments 20 and 22 are connected to one another through a linking segment 24. The linking segment 24 may be arranged to connect an end of the first segment 20 and an end of the second segment 22. The first segment 20 may be elongated from one end of the linking segment 24. The second segment 22 may be elongated oppositely against the first segment 20 from another end of the linking segment 24. Similarly, the first signal line 14 has a first segment 26, a second segment 28 laterally offset from the first segment, and a linking segment 30 which interconnects the first and second segments 26 and 28 to one another. The linking segment 30 may be arranged to connect an end of the first segment 26 and an end of the second segment 28. The first segment 26 may be elongated from one end of the linking segment 30. The second segment 28 may be elongated oppositely against the first segment 26 from another end of the linking segment 30.

The second shield line and second signal line within the second wiring level M2 have segments similar to those of the first wiring level M3. However, in order to simplify the explanation, the segments of the second shield line and second signal line will be referred to as third and fourth segments to distinguish them from the first and second segments of the first shield line 12 and first signal line 14. Accordingly, the second shield line 16 has a third segment 32 and a fourth segment 34 laterally offset from the third segment. The third and fourth segments 32 and 34 are connected to one another through a linking segment 36. The linking segment 36 may be arranged to connect an end of the third segment 32 and an end of the fourth segment 34. The third segment 32 may be elongated from one end of the linking segment 36. The fourth segment 34 may be elongated oppositely against the third segment 32 from another end of the linking segment 36. Similarly, the second signal line 18 has a third segment 38, a fourth segment 40 laterally offset from the third segment, and a linking segment 42 which interconnects the third and fourth segments 38 and 40 to one another. The linking segment 42 may be arranged to connect an end of the third segment 38 and an end of the fourth segment 40. The third segment 38 may be elongated from one end of the linking segment 42. The fourth segment 40 may be elongated oppositely against the third segment 38 from another end of the linking segment 42. In some embodiments, the linking segments 24 and 30 within the first wiring level M3 may be referred to as first linking segments, and the linking segments 36 and 42 within the second wiring level M2 may be referred to as second linking segments so that linking segments within the different wiring levels may be distinguished from one another.

An axis system is provided adjacent the top view of FIG. 2. The axis system shows a first axis 3 and a second axis 5 which extends orthogonally relative to the first axis. The first and second segments 20, 22, 26 and 28 extend primarily along a first direction corresponding to the axis 3, and the linking segments 24 and 30 extend primarily along a second direction corresponding to the axis 5. The segments are indicated to extend "primarily" along the indicated directions to indicate that the overall course of the segments is along the indicated directions even if the segments are wavy or otherwise not straight. In some embodiments the segments may be substantially straight, with the term "substantially straight" meaning that the segments are straight to within reasonable tolerances of fabrication and measurement.

The third and fourth segments 32, 34, 38 and 40 also extend primarily along the first direction corresponding to the axis 3, and the linking segments 36 and 42 extend primarily along the second axis 5 in the illustrated embodiment.

In the shown embodiment the linking segment 24 extends substantially orthogonally to the first and second segments 20 and 22 of shield line 12, the linking segment 30 extends substantially orthogonally to the first and second segments 26 and 28 of signal line 14, the linking segment 36 extends substantially orthogonally to the third and fourth segments 32 and 34 of the second shield line 16, and the linking segment 42 extends substantially orthogonally to the segments 38 and 40 of the second signal line 18. The term "substantially orthogonally" means that the linking segments extend orthogonally to the other indicated segments to within reasonable tolerances of fabrication and measurement. In other embodiments one or both of the linking segments may extend at an angle other than orthogonal relative to the primary direction of the segments interconnected by such linking segment.

An advantage of the architecture of FIG. 2 is that the offsets (i.e. bends) provided in the signal lines and shield lines enable a region of a shield line from the upper wiring level M3 to vertically overlap a region of a shield line from the lower wiring level M2. Specifically, the shield line 12 of the upper wiring level vertically overlaps a region of the shield line 16 of the lower wiring level within an illustrated overlap region 44; with the illustrated fourth segment 34 of the second shield line 16 extending to under the first segment 20 of the first shield line 12.

Vertical interconnects 46 are provided within the overlap region 44 to electrically couple the shield lines 16 and 12 to one another. The vertical interconnects 46 are illustrated in dashed-line (phantom) in the top view of FIG. 2 to indicate that the interconnects are beneath line 12. The vertical interconnects may extend substantially vertically, with the term "substantially vertically" meaning that the interconnects are vertical to within reasonable tolerances of fabrication and measurement.

The illustrated embodiment shows two vertical interconnects within the overlap region 44. In other embodiments there may be only a single interconnect provided within the overlap region, or there may be more than two interconnects provided within the overlap region. Also, although the interconnects 46 are square along the top view of FIG. 2, in other embodiments the interconnects may have other shapes, including, for example, rectangular, circular, elliptical, etc.

An alternative description of the assembly 10 of FIGS. 2-2C is as follows. The first shield line 12 within the upper wiring level may be considered to have a first portion 48 extending in the first direction of axis 3, a second portion 50 which extends in a second direction (e.g., the direction of axis 5), and a third portion 52 which extends in the first direction. The second portion 50 interconnects the first portion 48 with the third portion 52. The first signal line 14 within the upper wiring layer is immediately adjacent the first shield line, and has a fourth portion 54, a fifth portion 56, and a sixth portion 58. The fourth, fifth and sixth portions (54, 56 and 58) are substantially parallel to the third, second and first portions (52, 50 and 48), respectively. The term "substantially parallel" means parallel to within reasonable tolerances of fabrication and measurement.

Continuing the alternative description of assembly 10, the second shield line 16 within the lower wiring level comprises a seventh portion 60 and an eighth portion 62; with the seventh portion 60 being substantially vertically aligned with the third portion 52 of first shield line 12, and the eighth portion 62 being substantially vertically aligned with the fourth portion 54 of the first signal line 14. The second shield line 16 also comprises a ninth portion 64 which interconnects the seventh portion 60 with the eighth portion 62. The seventh portion 60 extends continuously from under the third portion 52 of first shield line 12 to under the sixth portion 58 of first signal line 14; with the seventh portion 60 being substantially vertically aligned with the third portion 52 of first shield line 12.

Further continuing the alternative description of assembly 10, the overlap region 44 extends across the third portion 52 of first shield line 12 and the seventh portion 60 of second shield line 16, and the vertical interconnects 46 electrically connect the third portion 52 with the seventh portion 60.

Figure 3:
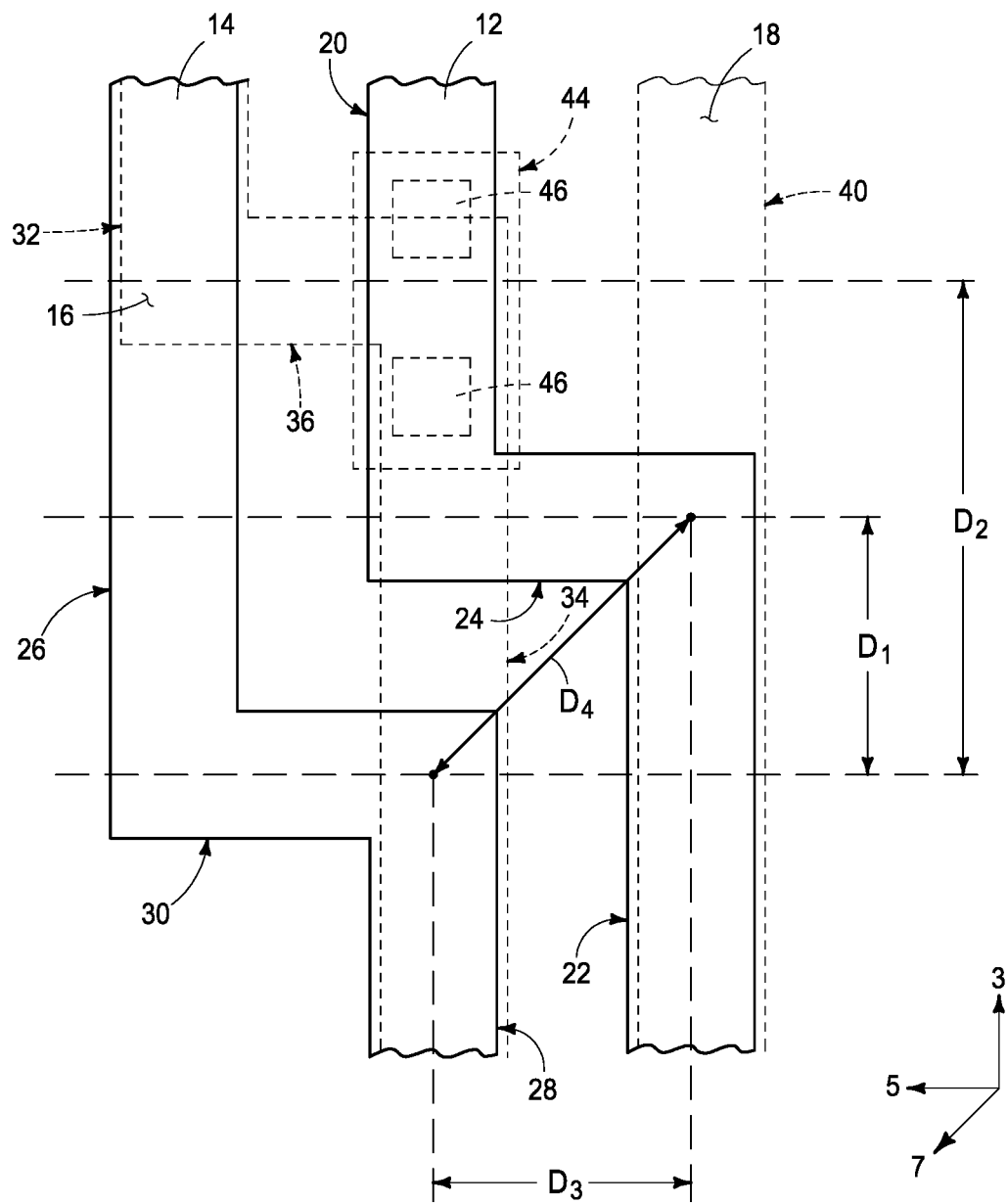
FIG. 3 is an enlarged view of a region "3" of FIG. 2.

FIG. 3 shows an enlarged view of a region "3" of the assembly 10 of FIG. 2, and will be used to describe some of the dimensional relationships within such assembly.

The shield line 12 may be considered an individual first shield line representative of a plurality of shield lines within the upper wiring level, and the signal line 14 may be considered an individual first signal line representative of a plurality of signal lines within the upper wiring level. Similarly, the second shield line 16 may be considered an individual second shield line representative of a plurality of second shield lines within the lower wiring level, and the second signal line 18 may be considered an individual second signal line representative of a plurality of second signal lines within the lower wiring level.

The first signal line 14 is immediately adjacent the first shield line 12, with the term "immediately adjacent" indicating that there are no other signal lines between signal line 14 and shield line 12 within the upper wiring level (i.e., that signal line 14 is the signal line closest to shield line 12 within the upper wiring level).

The first shield line 12 has the first shield line first segment 20, the first shield line second segment 22, and the linking segment 24 between the first and second segments 20 and 22. The linking segment 24 may be referred to as a first shield line linking segment.

The signal line 14 includes the first signal line first segment 26, the first signal line second segment 28, and the linking segment 30 between the first and second segments 26 and 28. The linking segment 30 may be referred to as a first signal line linking segment.

The first shield line linking segment 24 is offset from the first signal line linking segment 30 along the first direction of axis 3 by a first distance $D_1$.

The second shield line 16 comprises a third segment 32 that is under a region of the first signal line first segment 26. The second shield line 16 also has a fourth segment 34 that extends to under a region of the signal line second segment 28, and that also extends to under a region of the first shield line first segment 20. A second shield line linking segment 36 connects the third segment 32 with the fourth segment 34.

The vertical interconnects 46 extend between the first shield line first segment 20 and the second shield line fourth segment 34 to electrically couple the first and second shield lines 12 and 16 to one another (i.e., to electrically couple the shield line 12 from the upper wiring layer with the shield line 16 from the lower wiring layer).

The second shield line linking segment 36 is offset from the first signal line linking segment 30 along the first direction of axis 3 by a second distance $D_2$.

The second distance $D_2$ is larger than the first distance $D_1$, and in some embodiments may be at least double the first distance.

FIG. 3 also shows that the first shield line 12 and first signal line 14 are spaced from one another by a third signal line distance $D_3$ corresponding to a pitch, and shows that adjacent corners of shield line 12 and signal line 14 are spaced by a fourth distance $D_4$ which extends along a direction corresponding to an axis 7. The direction of axis 7 is intermediate the directions of axes 3 and 5, and in some embodiments may be about 45° (i.e., halfway between axes 3 and 5).

In some embodiments the $D_4$ shift may be considered equivalent to a $D_3$ shift in combination with a $D_1$ shift.

In some embodiments the illustrated linking segments (e.g., 24, 30 and 36) may be considered to define steps or bridge paths along the various shield lines and signal lines.

Figure 1:
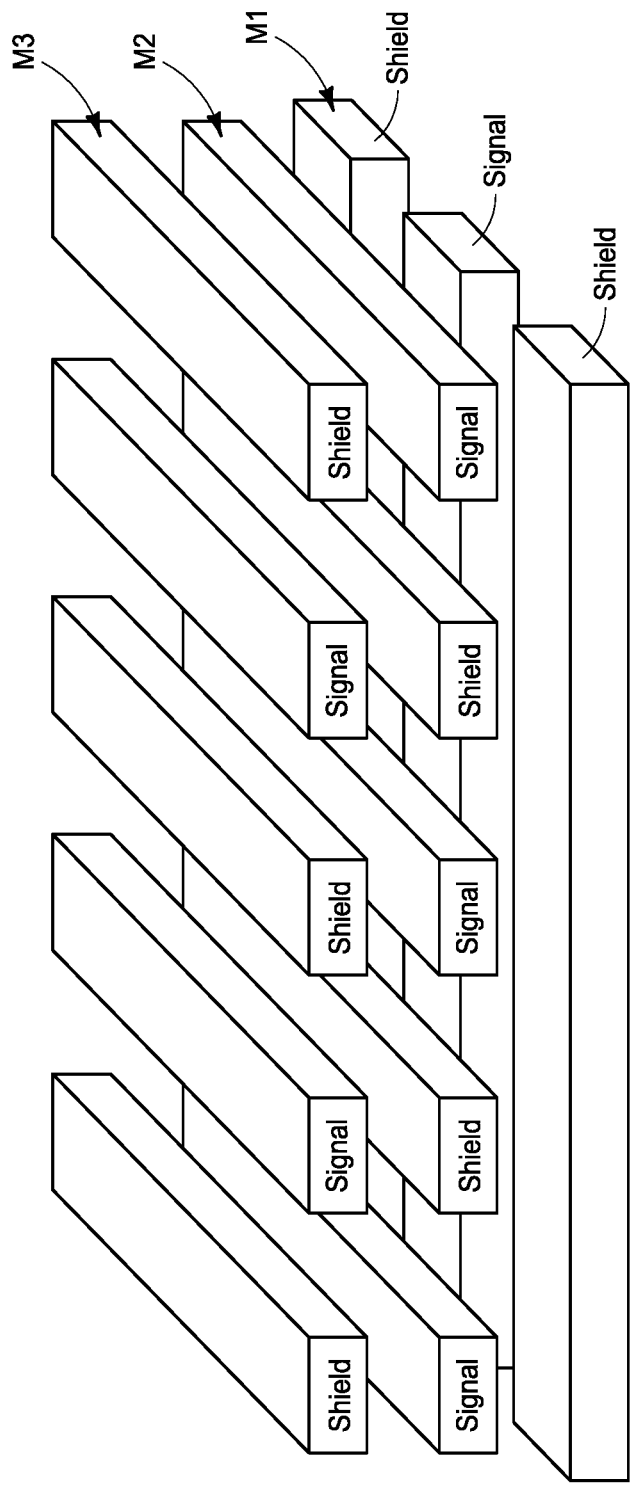
FIG. 1 is a diagrammatic three-dimensional view of a prior art arrangement of wiring levels.
Figure 4:
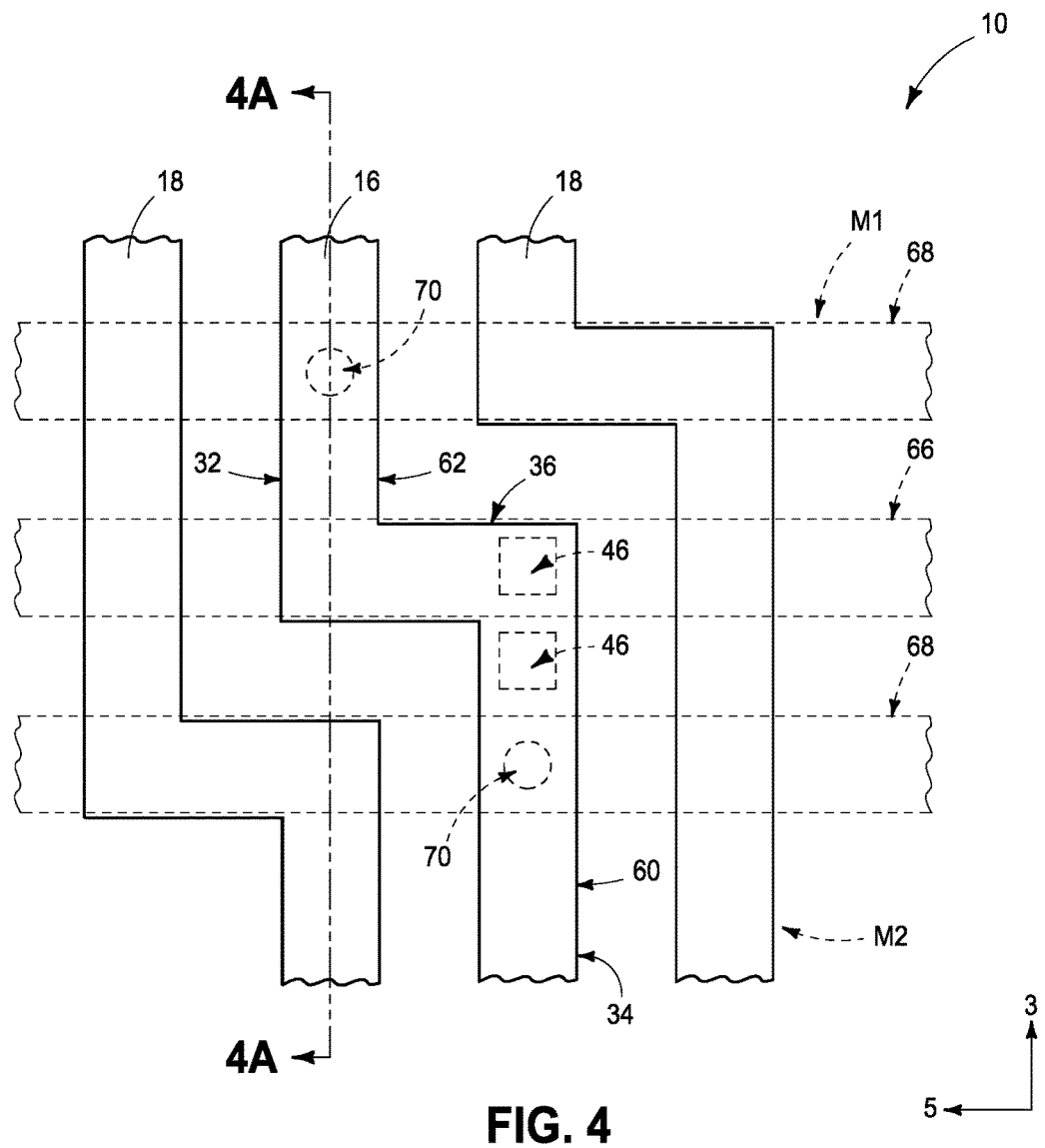
FIGS. 4 and 4A are diagrammatic views of an example embodiment arrangement of wiring levels.
Figure 4A:
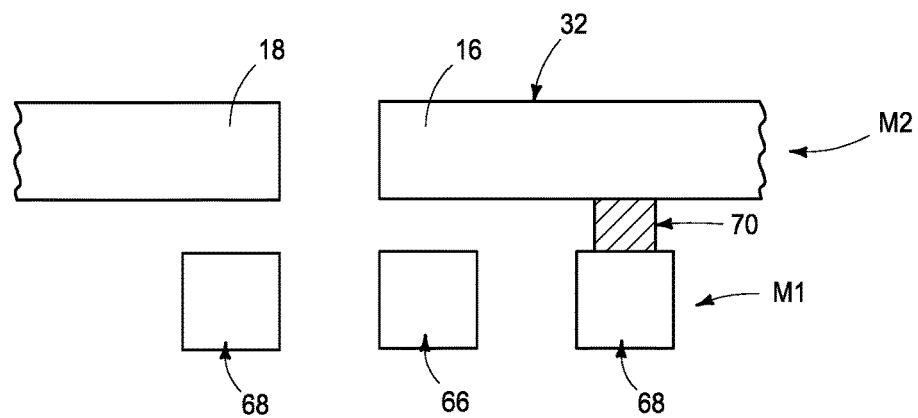

The wiring level M2 of FIGS. 2 and 3 may be over another wiring level analogous to the level M1 of FIG. 1. FIGS. 4 and 4A show a region of assembly 10 beneath the region illustrated in FIGS. 2 and 3, and specifically show a third wiring level M1 under the second wiring level M2 (the level M3 is not shown in FIGS. 4 and 4A in order to simplify the drawings). The illustrated region of the wiring level M2 of FIG. 4 has the second shield line 16 between a pair of second signal lines 18.

The wiring level M1 includes a signal line 66 between a pair of shield lines 68. The signal lines and shield lines within the third wiring level M1 may be referred to as third signal lines and third shield lines in order to distinguish them from the second shield lines and second signal lines within the second wiring level M2, and to distinguish them from the first shield lines and first signal lines within the first wiring level M3 (FIG. 2). In the illustrated embodiment, the shield lines and signal lines within the wiring level M1 extend primarily along the direction of axis 5, or in other words extend substantially orthogonally to the third and fourth segments 32 and 34 of the second shield line 16.

The third shield lines 68 are electrically coupled to the third and fourth segments 32 and 34 of the second shield line 16 through vertical interconnects 70 (or alternatively considered, are electrically coupled to the seventh and eighth portions 60 and 62 of the second shield line through the vertical interconnects 70). In some embodiments, the vertical interconnects 46 (i.e., the interconnects utilized to connect shield lines within the first wiring level M3 to shield lines within the second wiring level M2) may be referred to as a first set of interconnects, and the interconnects 70 may be referred to as a second set of interconnects in order to distinguish the interconnects 70 from the interconnects 46. The interconnects 46 and 70 are shown to be square and circular in the top view of FIG. 4 in order to provide clear visual distinction between interconnects 46 and 70. In actual practice the interconnects 46 and 70 may be the same shape as one another or may be different shapes; and may be of any suitable shapes, including, for example, square, rectangular, circular, elliptical, etc. The vertical interconnects 70 are illustrated in dashed-line (phantom) in the top view of FIG. 4 to indicate that the interconnects 70 are beneath line 16, and the interconnects 46 are illustrated in dashed-line view to indicate that it is locations of interconnects 46 illustrated in such view (the interconnects 46 may or may not be visible in the view of FIG. 4 depending on the particular architecture of the interconnects 46 and on whether the location chosen for the view of FIG. 4 is a cross-section through the interconnects 46).

Figure 5:
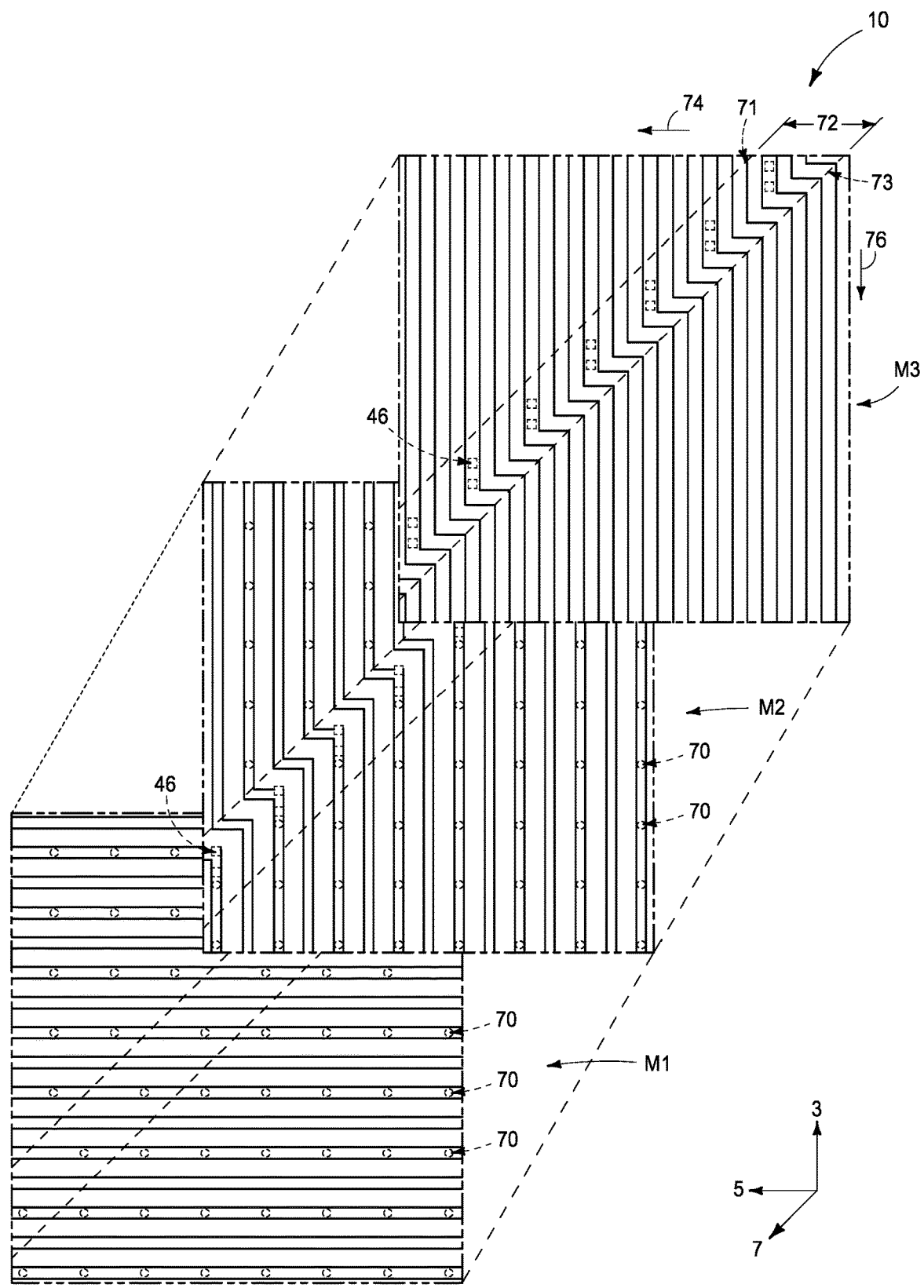
FIG. 5 is an exploded view of an example embodiment assembly of wiring levels. Three levels are stacked in the view of FIG. 5.
Figure 6:
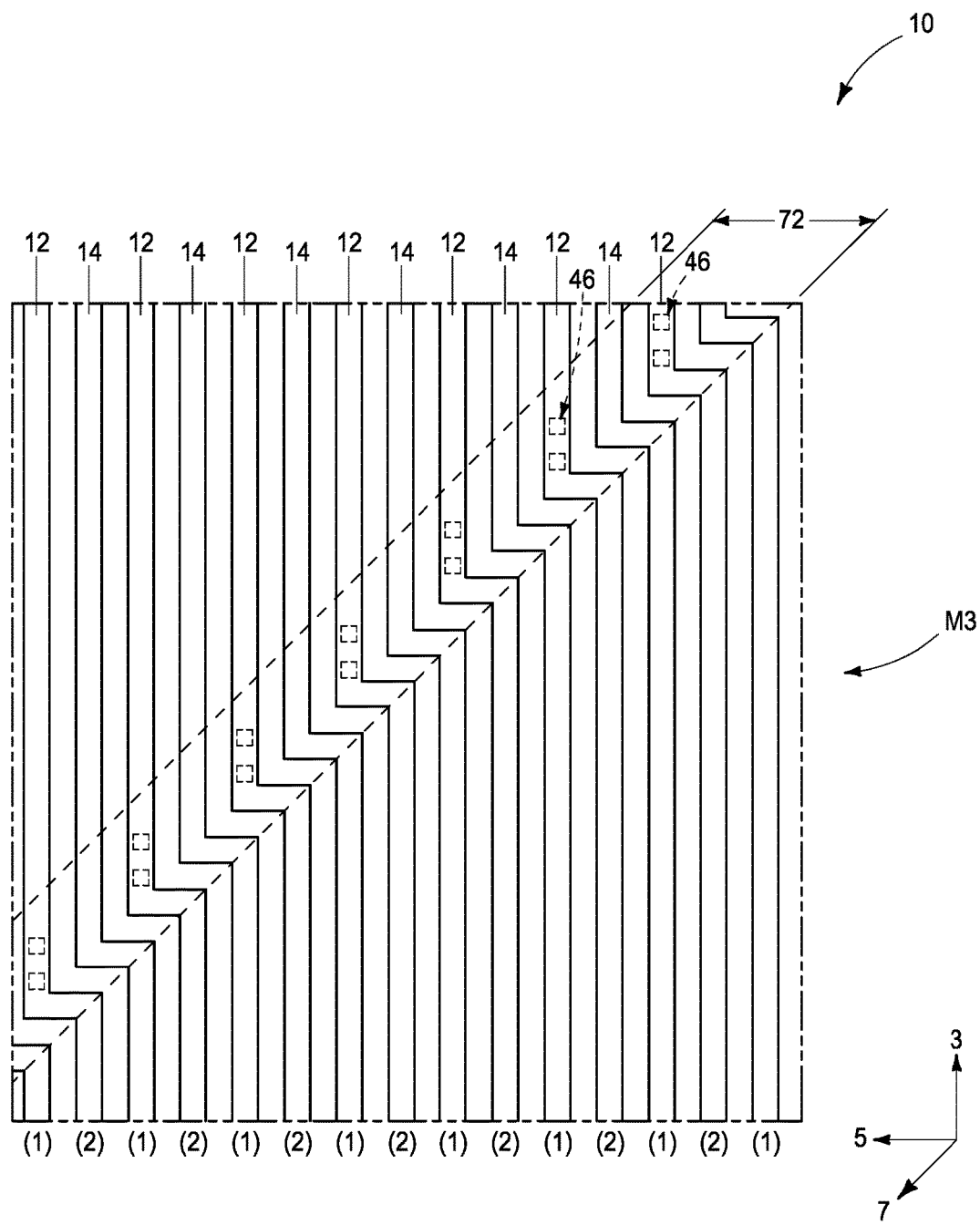
FIGS. 6-8 are diagrammatic top views of the individual levels of FIG. 5.
Figure 7:
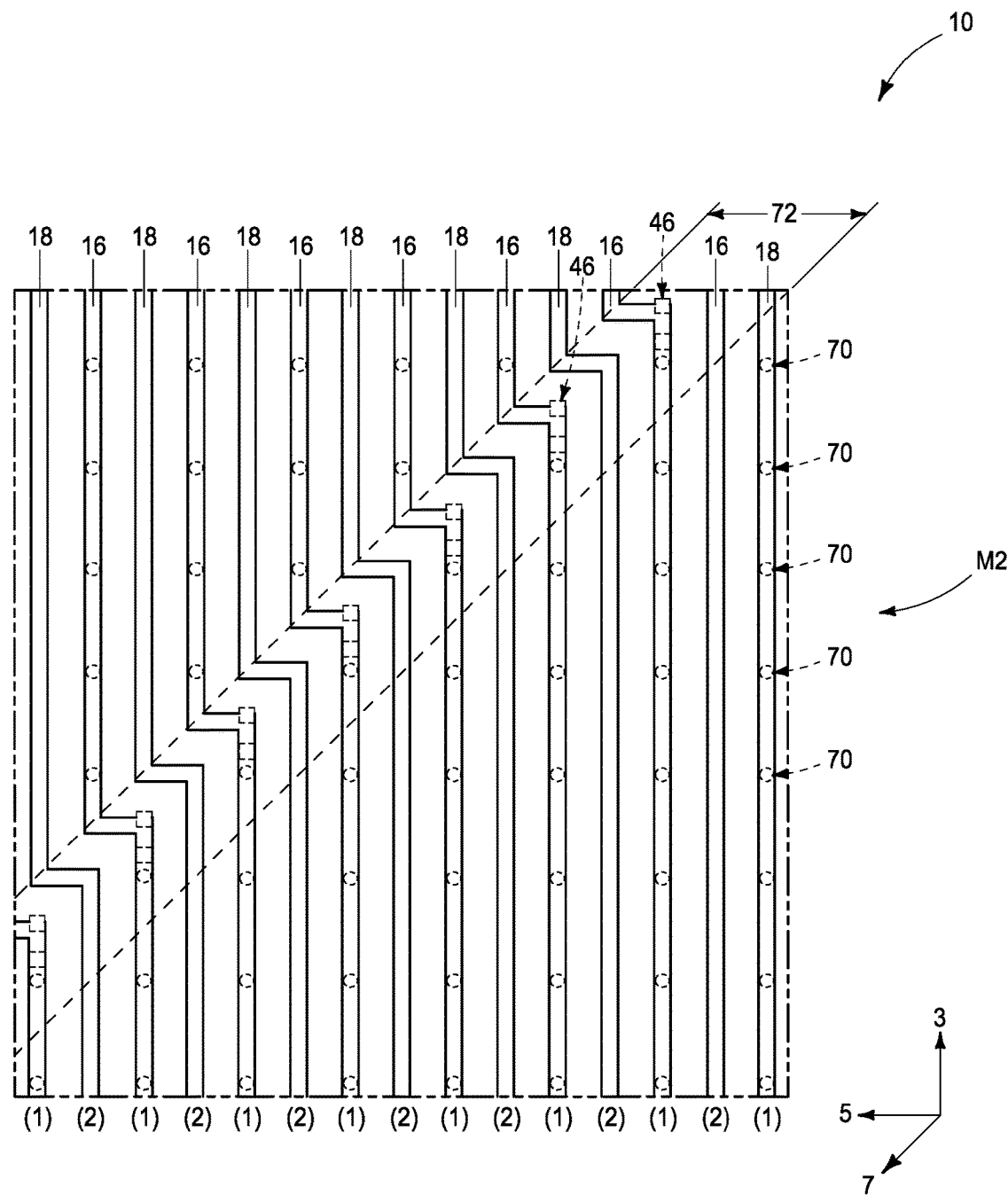
Figure 8:
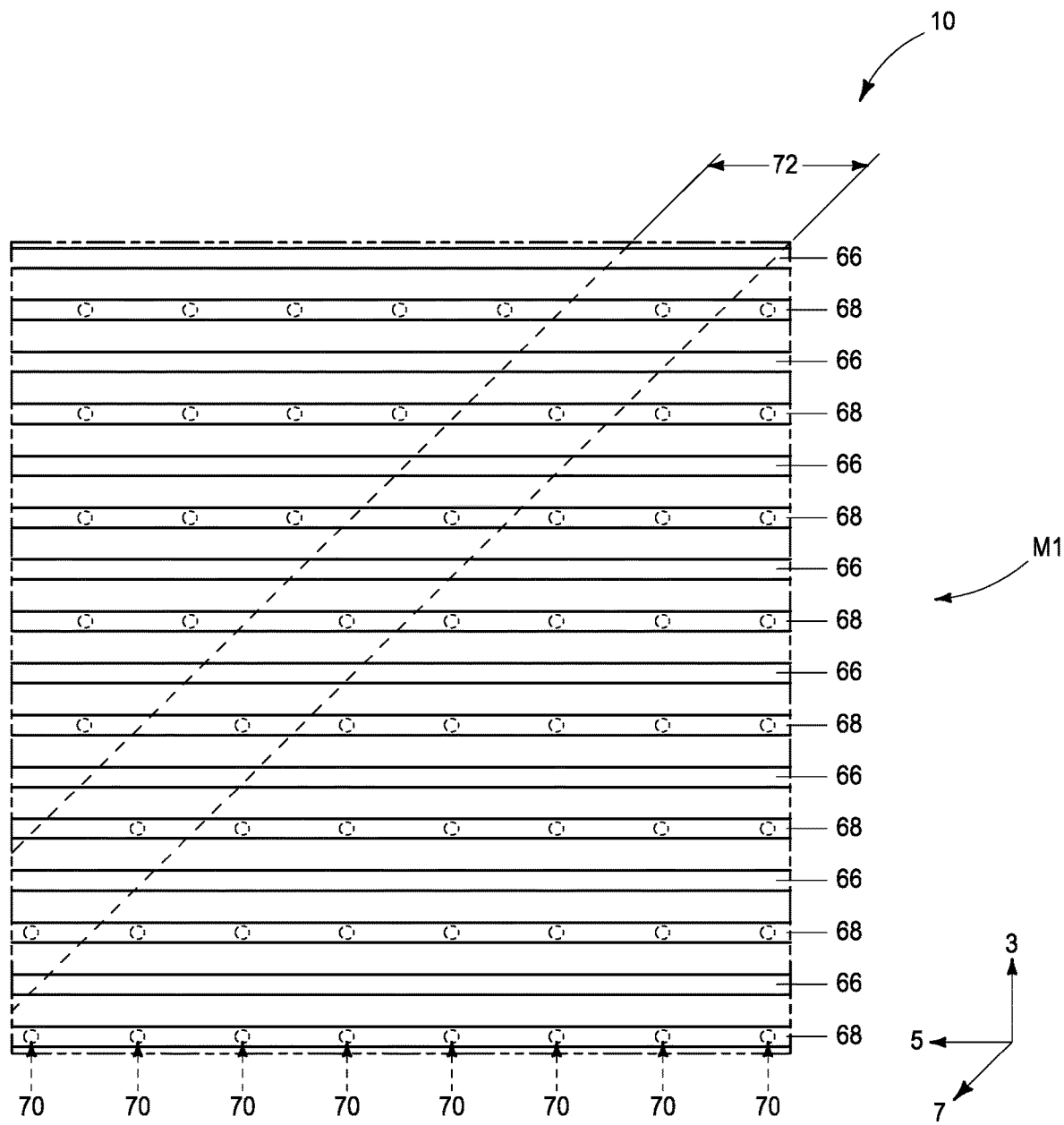

FIGS. 5-8 further illustrate an assembly 10 comprising the wiring levels M1, M2 and M3. FIG. 5 is an exploded view showing the wiring levels stacked one atop another; while FIGS. 6-8 show each of the individual wiring levels M1, M2 and M3 in isolation. The wiring within level M3 is shown to be slightly thicker than the wiring within levels M2 and M1. In practice the wiring within levels M1-M3 may all be the same thickness or some wiring may be of different thickness relative to other wiring, depending on the application.

The assembly 10 of FIGS. 5-8 may be considered to comprise a connecting region 72 which encompasses the interconnects 46, and more specifically encompasses locations where portions of the shield lines 12 of level M3 vertically overlap portions of the shield lines 16 of level M2. The linking regions of the shield lines and signal lines within the levels M2 and M3 are within the connecting region 72 (such linking regions are described above with reference to FIG. 2, and may be alternatively referred to as bending regions, bridge regions, etc.).

The connecting region may be considered to comprise a first boundary 71 and a second boundary 73. A first shield region 74 extends outwardly from the connecting region 72 along the direction of axis 5, and a second shield region 76 extends outwardly from the connecting region 72 along the direction of axis 3. The signal lines 14 of level M3 vertically overlap the shield lines 16 of level M2 within the first and second shield regions 74 and 76; and the shield lines 12 of level M3 vertically overlap the signal lines 18 of level M2 within the first and second shield regions.

In the embodiment of FIGS. 5-8, all of the shield lines within the wiring levels M3, M2 and M1 are electrically connected with Vss (the voltage Vss may be any suitable voltage, and in some embodiments may be ground or a negative supply voltage). The various shield lines from the wiring levels M3, M2 and M1 together may form a three-dimensional mesh 78 of the type shown in FIG. 9, with such mesh having consistent voltage throughout. Specifically, the mesh of FIG. 9 comprises the first shield lines 12 from the upper wiring level M3, the second shield lines 16 from the intermediate wiring level M2, and the third shield lines 68 from the lower wiring level M1. The shield lines 12, 16 and 68 are illustrated with different thicknesses of lines so they may be distinguished from one another in the diagram of FIG. 9. In actual practice, the shield lines may all have substantially the same thickness as one another (or in some embodiments, some of the shield lines may have different thicknesses than others if such is suitable for particular applications). Regions where shield lines from level M3 connect with shield lines from level M2 are shown as overlap regions 44, and such would comprise the vertical interconnects 46 (shown in FIGS. 5-8, but not shown in FIG. 9).

Figure 9:
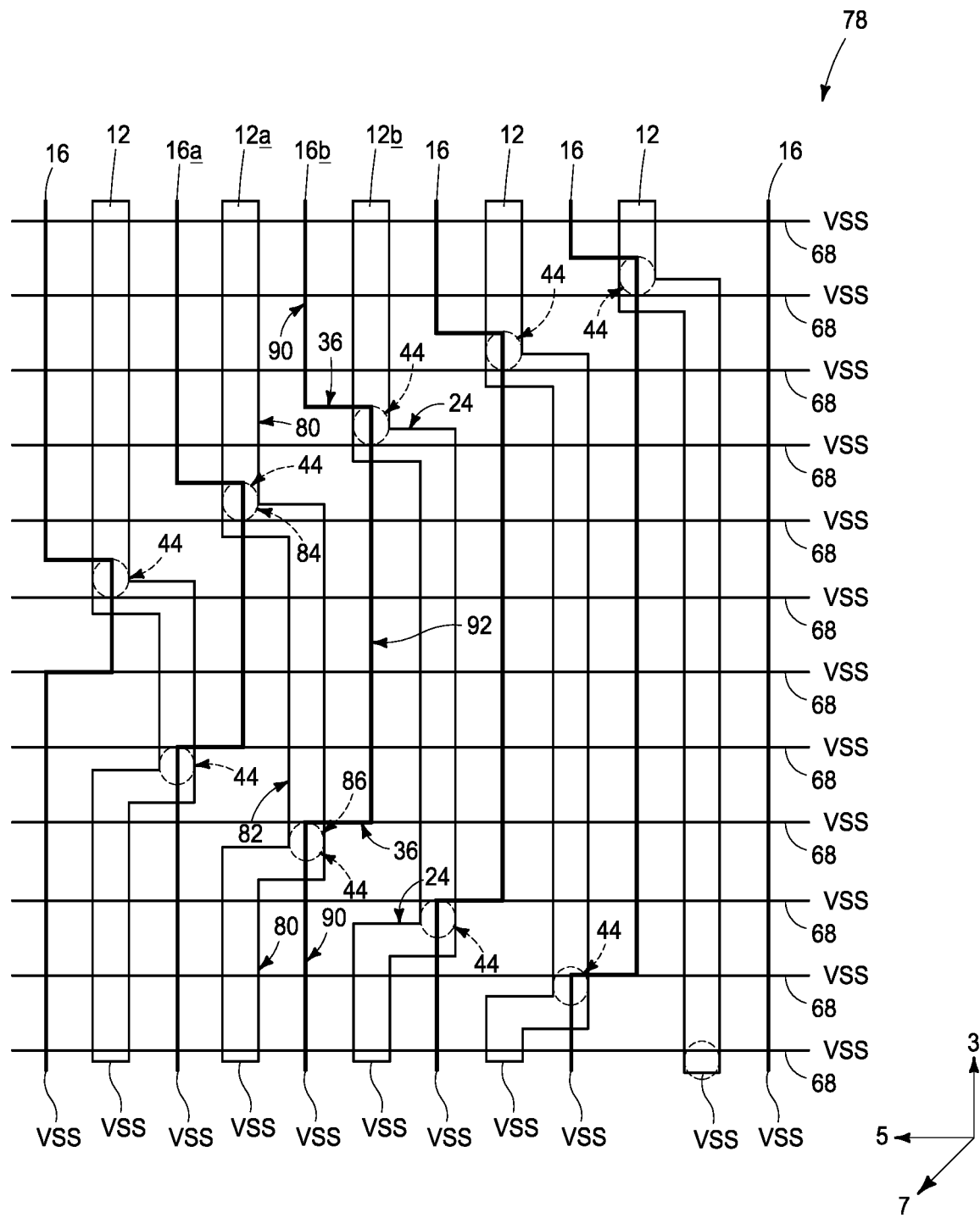
FIG. 9 is a diagrammatic top view showing an example mesh containing interconnected shield lines of the three levels of FIG. 5.

One aspect of the embodiment of FIG. 9 is that each of the first shield lines 12 from the top wiring level M3 is directly connected to a pair of the second shield lines 16 from the intermediate wiring level M2; and conversely, each of the second shield lines 16 from the intermediate wiring level is directly connected to a pair of the first shield lines 12 from the top wiring level. The shield lines 12 and 16 comprise the bridging regions (i.e. linking regions) 24 and 36 described previously.

FIG. 9 shows two of the first shield lines 12 labeled as 12a and 12b to distinguish them from others of the first shield lines, and shows two of the second shield lines 16 labeled as 16a and 16b to distinguish them from others of the second shield lines. The first shield line 12a extends primarily along a first direction corresponding to the axis 3, and extends along two first paths 80 and 82 which are laterally offset relative to one another. Similarly, the second shield line 16b extends primarily along the first direction of axis 3, and extends along two second paths 90 and 92 which are laterally offset relative to one another. The first shield line 12a is primarily laterally offset from the second shield lines 16 except that the first paths 80 and 82 have overlap regions 44 where portions of the first shield line 12a overlap portions of the second shield lines 16a and 16b. Specific overlap regions where portions of the first shield line 12a overlap portions of second shield lines 16a and 16b are labeled as 84 and 86.

Notably, the path 80 of shield line 12a overlaps a second shield line 16a, while the path 82 of the same first shield line 12a overlaps a different second shield line 16b. In a similar manner, the second shield line 16b connects with two different first shield lines 12a and 12b. Vertical interconnects 46 (not shown in FIG. 9) are provided within the overlap regions 44 to connect the first shield lines 12 with the second shield lines 16.

The shield lines 68 of the bottom wiring level M1 may be connected to the shield lines 16 of the intermediate wiring level M2 through vertical contacts 70 (not shown in FIG. 9) of the type described above with reference to FIG. 4.

The interwoven interconnections between the first, second and third wiring levels within mesh 78 enable consistent voltage to be maintained throughout all of the shield lines that are intertwined within such mesh. Such may alleviate or prevent the problems described above in the "Background" section of this disclosure.

FIGS. 5-9 illustrate an embodiment in which all of the shield lines are maintained at a common voltage (illustrated as being Vss, but in other embodiments it may be a common voltage other than Vss). In some embodiments the shield lines may be subdivided amongst groups maintained at different voltages relative to one another. For instance, in some embodiments some of the shield lines may be maintained at Vss while others are maintained at Vdd. An example embodiment in which some shield lines are electrically connected with Vss while others are electrically connected with Vdd is described with reference to FIGS. 10-14.

Figure 10:
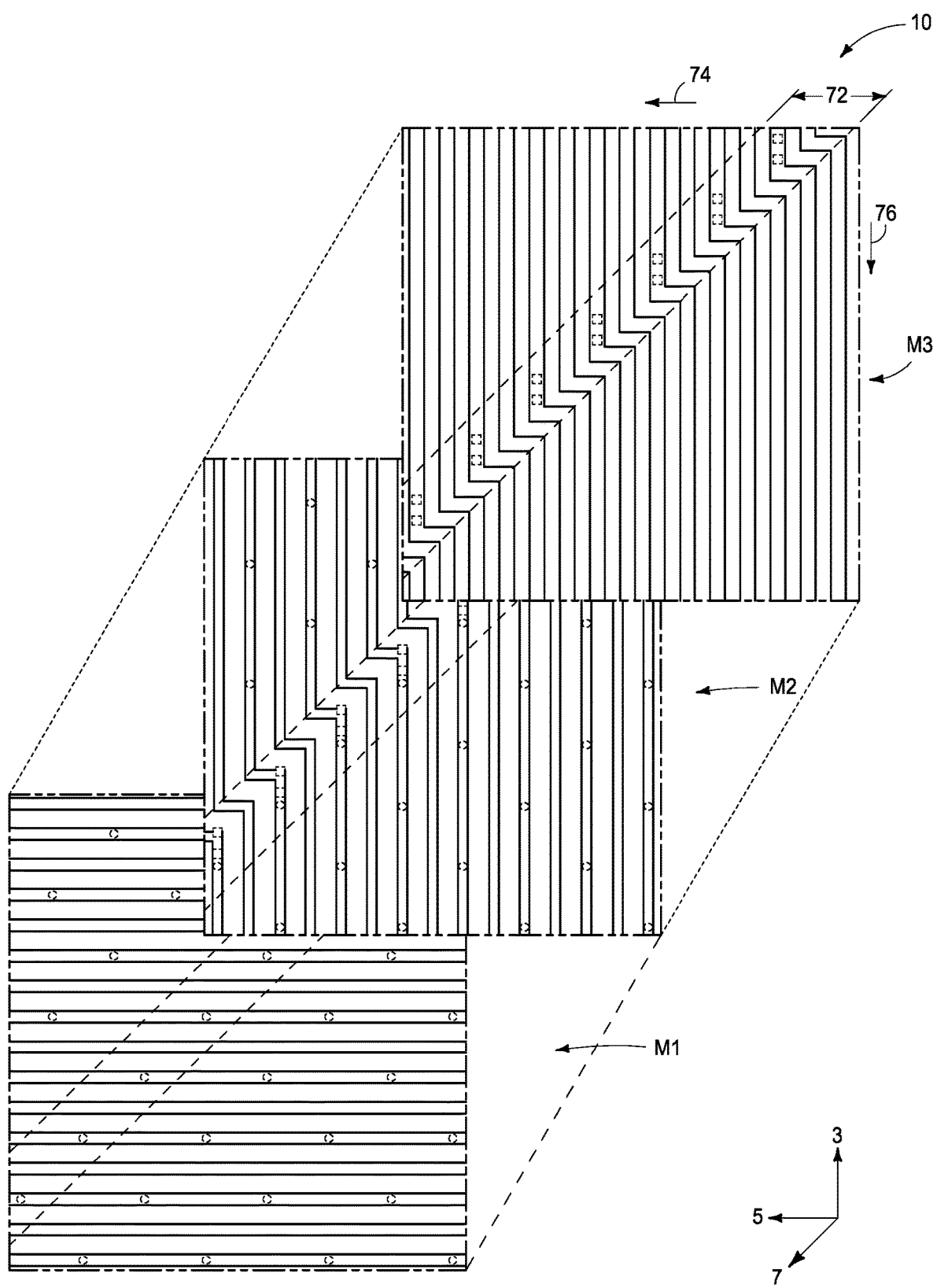
FIG. 10 is an exploded view of another example embodiment assembly of wiring levels. Three levels are stacked in the view of FIG. 10.
Figure 11:
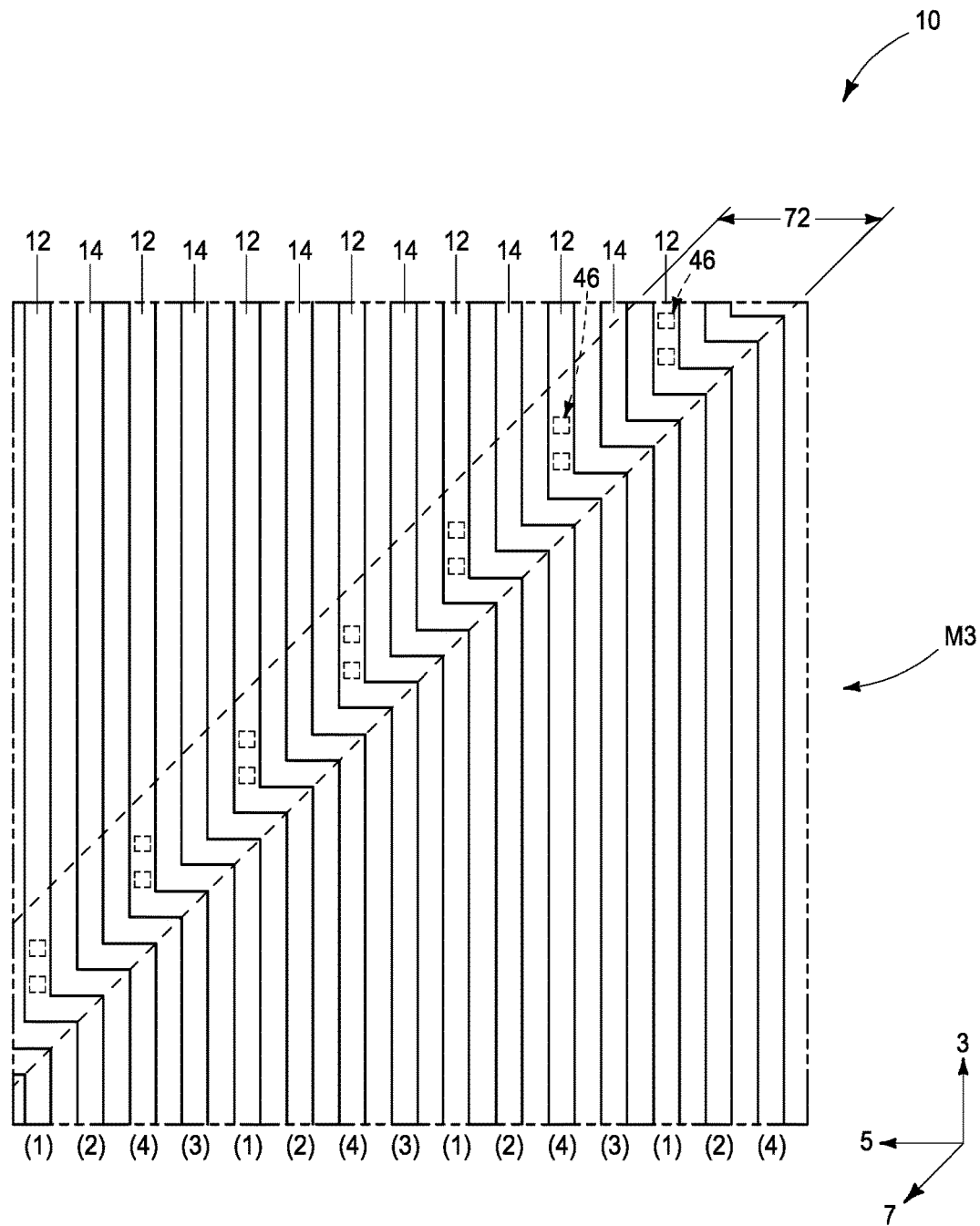
FIGS. 11-13 are diagrammatic top views of the individual levels of FIG. 10.
Figure 12:
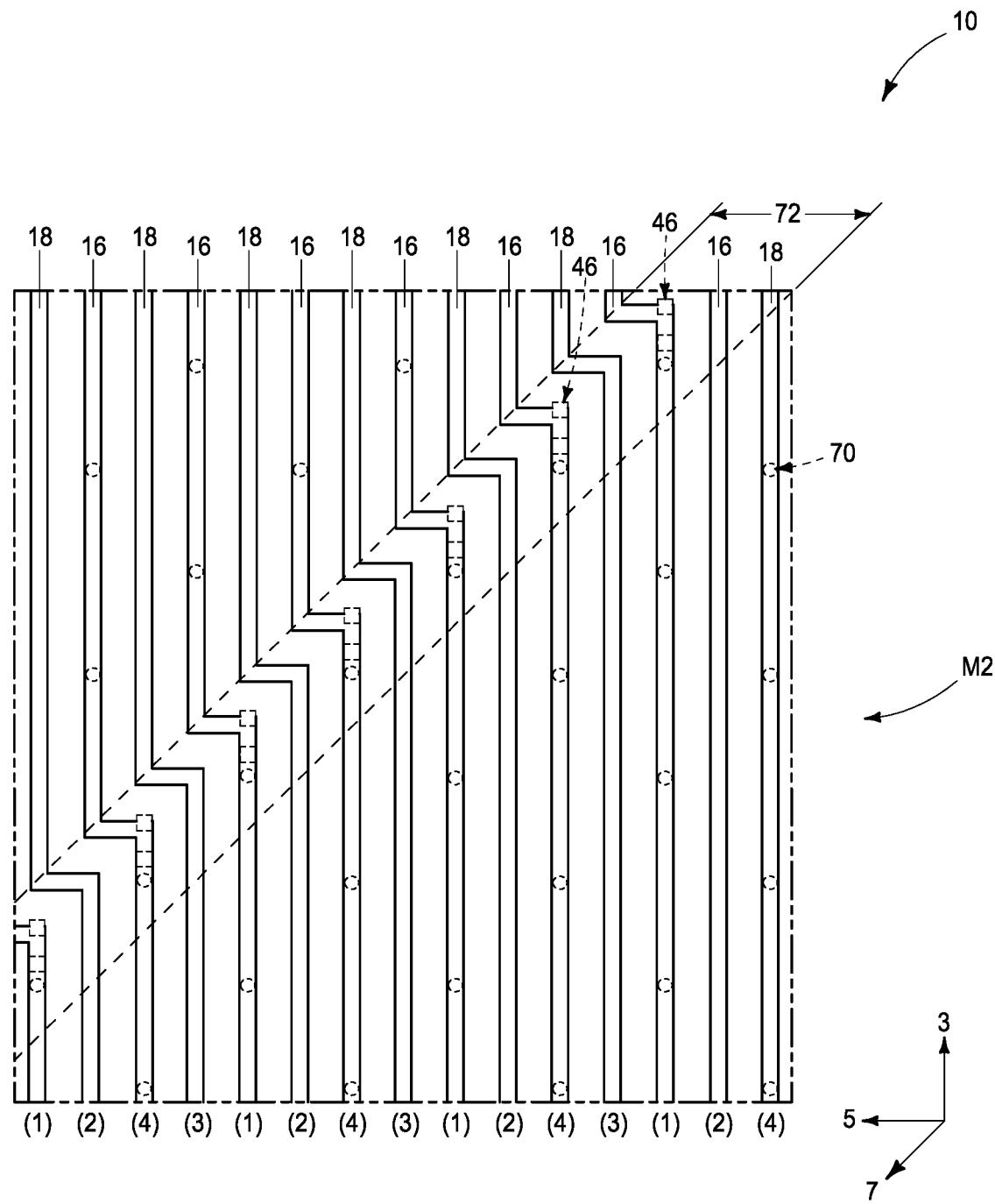
Figure 13:
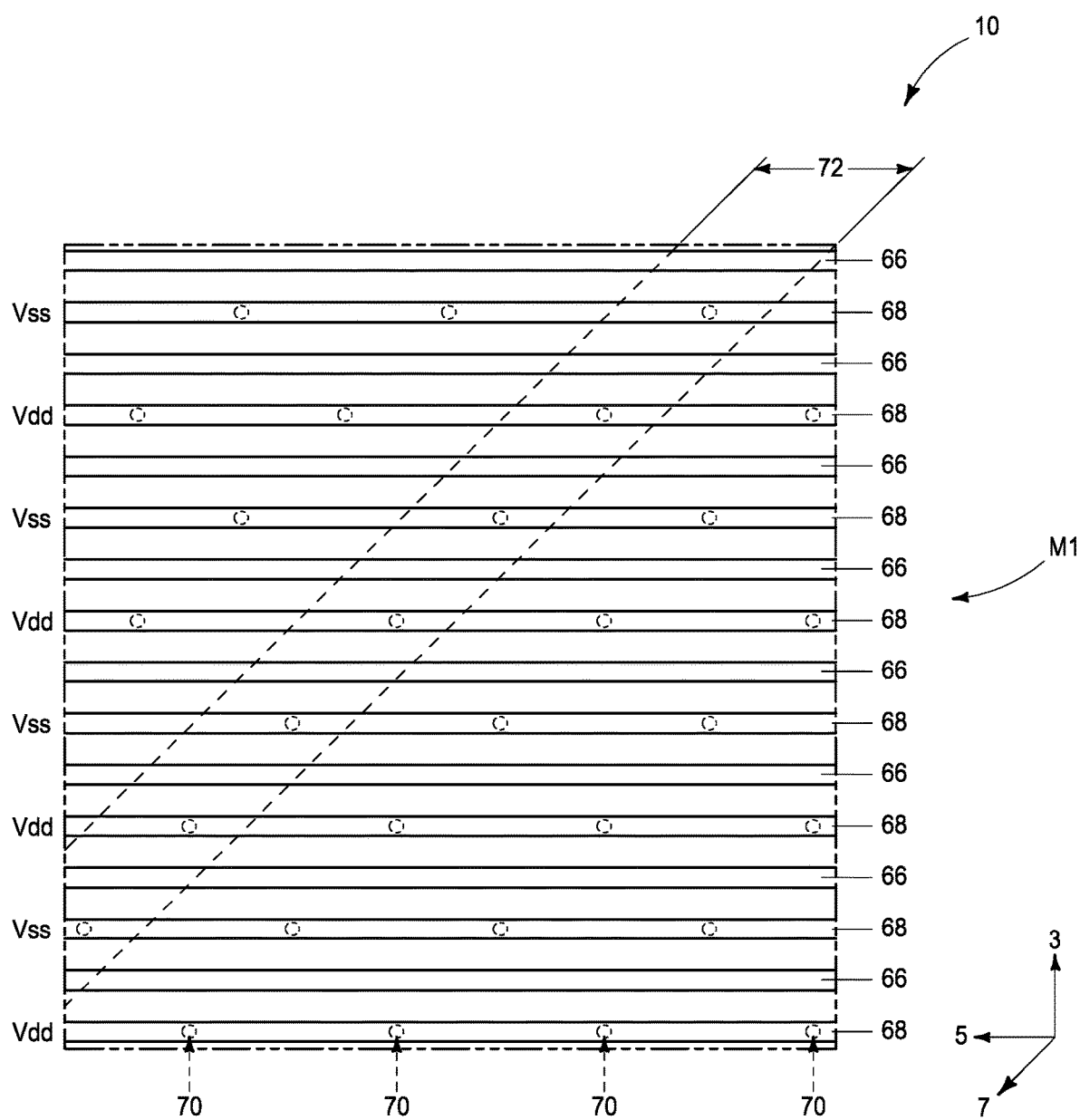

The wiring levels M1, M2 and M3 of assembly 10 are illustrated in FIGS. 10-13. FIG. 10 is an exploded view showing the wiring levels stacked one atop another; while FIGS. 11-13 show each of the individual wiring levels M1, M2 and M3 in isolation.

The general architecture of FIGS. 10-13 is similar to that described above with service to FIGS. 5-8, except that additional complexity is introduced so that the shield lines within the various levels M1-M3 may comprise some shield lines electrically connected with Vdd and others are electrically connected with Vss.

Figure 14:
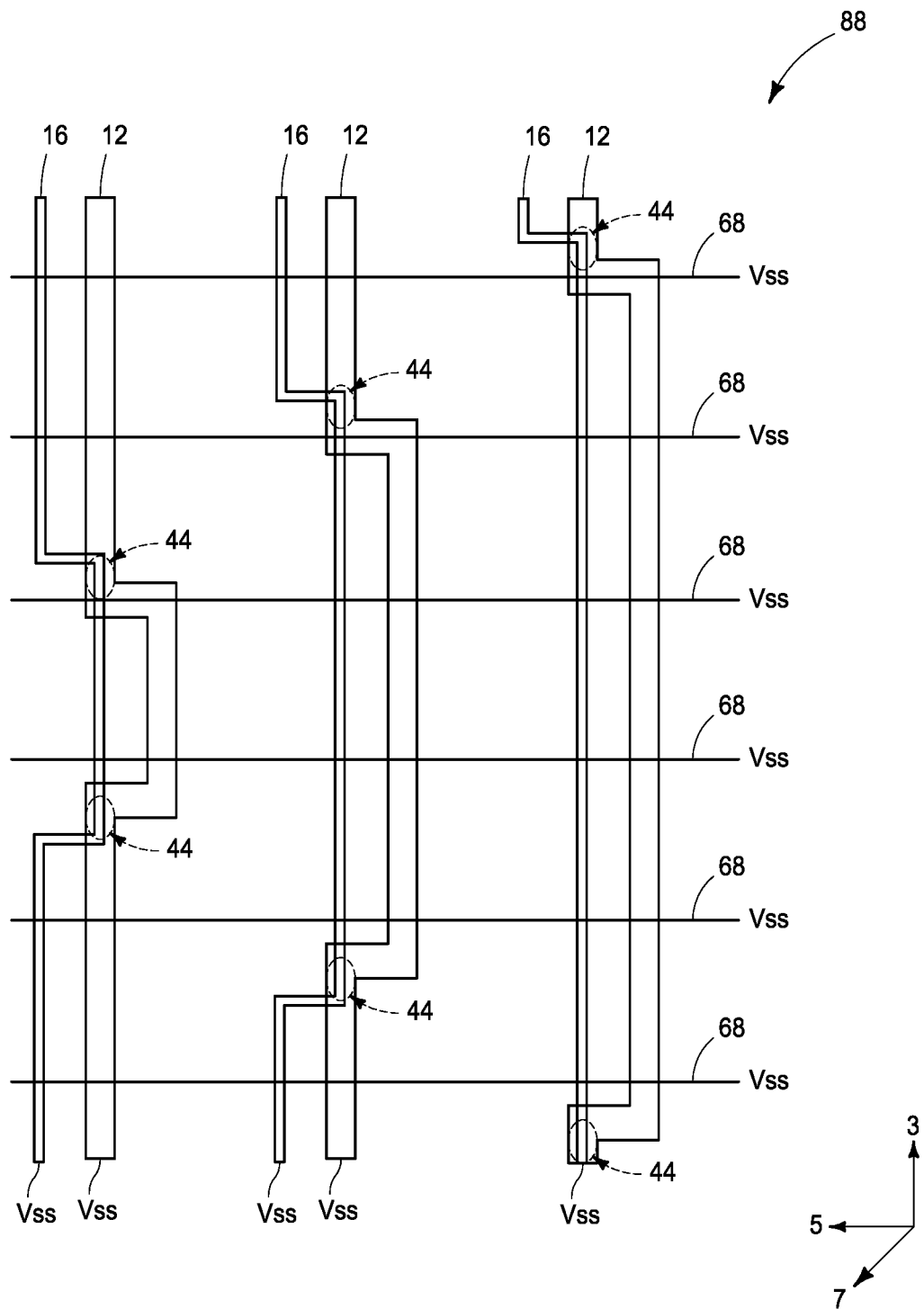
FIG. 14 is a diagrammatic top view showing an example mesh containing interconnected shield lines of the three levels of FIG. 10.

The various shield lines from the wiring levels M3, M2 and M1 together may form a pair of three-dimensional meshes similar to the mesh shown in FIG. 9. One of such meshes is electrically connected with Vss and the other is electrically connected with Vdd. FIG. 14 shows a three-dimensional mesh 88 which is electrically connected with Vss, and a similar mesh (not shown) would be electrically connected with Vdd.

The assemblies discussed above may be incorporated into integrated circuitry supported by an underlying semiconductor substrate (not shown). The substrate may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The assemblies discussed above may be utilized in electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an assembly (e.g., 10) having a first wiring level (e.g., M3) with a plurality of first shield lines (e.g., 12) and first signal lines (e.g., 14) in alternating arrangement. The first shield lines and first signal lines have first segments (e.g., 20, 26) extending along a first direction (e.g., the direction of axis 3), second segments (e.g., 22, 28) extending along the first direction and laterally offset from the first segments, and first linking segments (e.g., 24, 30) interconnecting the first and second segments to one another. The assembly includes a second wiring level (e.g., M2) below the first wiring level and having a plurality of second shield lines (e.g., 16) and second signal lines (e.g., 18) in alternating arrangement. The second shield lines and second signal lines have third segments (e.g., 32, 38) extending along the first direction, fourth segments (e.g., 34, 40) extending along the first direction and laterally offset from the third segments, and second linking segments (e.g., 36, 42) interconnecting the third and fourth segments to one another. The fourth segments of the second shield lines extend to under the first segments of the first shield lines and are electrically coupled to the first segments of the first shield lines through vertical interconnects (46).

Some embodiments include an assembly (e.g., 10) having a first wiring level (e.g., M3) which includes a plurality of first shield lines (e.g., 12) and first signal lines (e.g., 14) in alternating arrangement. The assembly has a second wiring level (e.g., M2) below the first wiring level and which includes a plurality of second shield lines (e.g., 16) and second signal lines (e.g., 18) in alternating arrangement. One of the first shield lines has a first portion (e.g., 48) extending in a first direction (e.g., the direction of axis 3), a second portion (e.g., 50) extending in a second direction (e.g., the direction of axis 5), and a third portion (e.g., 52) extending in the first direction. The second portion interconnects the first and third portions with each other. One of the first signal lines is immediately adjacent said one of the first shield lines. Said one of the first signal lines has fourth, fifth and sixth portions (e.g., 54, 56, 58) that are substantially parallel to the third, second and first portions, respectively, of said one of the first shield lines. One of the second shield lines includes seventh and eighth portions (e.g., 60, 62) that are under and substantially vertically aligned with the third portion of the first shield line and the fourth portion of the first signal line, respectively. A vertical interconnect (e.g., 46) electrically connects the third portion of said one of the first shield lines to the seventh portion of said one of the second shield lines.

Some embodiments include an assembly (e.g., 10) which has a first wiring level (e.g., M3) comprising a plurality of first shield lines (e.g., 12) and first signal lines (e.g., 14) in alternating arrangement. The assembly has second wiring level (e.g., M2) below the first wiring level and which includes a plurality of second shield lines (e.g., 16) and second signal lines (e.g., 18) in alternating arrangement. A mesh structure (e.g., 78) comprises the first shield lines electrically coupled with the second shield lines. Each of the first shield lines of the mesh structure extends primarily along a first direction (e.g., the direction of axis 3), and extends along two first paths (e.g., 80, 82) which are laterally offset relative to one another. Each of the second shield lines of the mesh structure extends primarily along the first direction and extends along two second paths (e.g., 90, 92) which are laterally offset relative to one another. The first shield lines of the mesh structure are primarily laterally offset from the second shield lines of the mesh structure except that each of the first paths of each of the first shield lines have overlap regions (e.g., 44) where portions of the first shield lines vertically overlap portions the second shield lines. Vertical interconnects (e.g., 46) are within said overlap regions to connect the first shield lines with the second shield lines. One of the first paths of an individual first shield line has an overlap region which is over a different second shield line than is the other of the first paths of the individual first shield line.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An assembly comprising:
   first, second and third paths extending in a first direction and being substantially parallel to one other, wherein the second path is between the first and third paths;
   a first conductive line at a first wiring level, wherein the first conductive line comprises a first segment having a first width across the first segment and having a first length that exceeds the first width, the first segment extending lengthwise in the first direction along the second path, a second segment having a second width across the second segment and having a second length that exceeds the second width, the second segment extending lengthwise in the first direction along the first path, a first linking segment having a third width across the first linking segment and having a third length that exceeds the third width, the first linking segment extending lengthwise in a second direction crossing the first direction to couple the first segment to the second segment, a third segment having a fourth width across the third segment and having a fourth length that exceeds the fourth width, the third segment extending lengthwise in the first direction along the second path, and a second linking segment having a fifth width across the second linking segment and having a fifth length that exceeds the fifth width, the second linking segment extending lengthwise in the second direction to couple the second segment to the third segment;

a second conductive line at a second wiring level different from the first wiring level, wherein the second conductive line comprises a fourth segment having a sixth width across the fourth segment and having a six length that exceeds the sixth width, the fourth segment extending lengthwise in the first direction along the third path, a fifth segment having a seventh width across the fifth segment and having a seventh length that exceeds the seventh width, the fifth segment extending in the first direction along the second path, a third linking segment having an eighth width across the third linking segment and having an eighth length that exceeds the eighth width, the third linking segment extending lengthwise in the second direction to couple the third segment to the fifth segment, a sixth segment having a ninth width across the sixth segment and having a ninth length that exceeds the ninth width, the sixth segment extending lengthwise in the first direction along the third path, and a fourth linking segment having a tenth width across the fourth linking segment and having a tenth length that exceeds the tenth width, the fourth linking segment extending lengthwise in the second direction to couple the fifth segment to the sixth segment, and wherein the fifth segment includes a first portion overlapping with a second portion of the first segment of the first conductive line; and a first vertical interconnect between the first and second conductive lines to couple the first portion of the fifth segment of the second conductive line to the second portion of the first segment of the first conductive line.

2. The assembly of claim 1, wherein the fifth segment of the second conductive line is terminated between the first and third segments of the first conductive line.

3. The assembly of claim 2, wherein each of the first and second conductive lines is supplied with a power voltage.

4. The assembly of claim 3, wherein the power voltage is Vss.

5. The assembly of claim 3, wherein the power voltage is Vdd.

6. The assembly of claim 2, further comprising a third conductive line at the first wiring level, wherein the third conductive line comprises a seventh segment having an eleventh width across the seventh segment and having an eleventh length that exceeds the eleventh width, the seventh segment extending lengthwise in the first direction along the third path, an eighth segment having a twelfth width across the eighth segment and having a twelfth length that exceeds the twelfth width, the eighth segment extending lengthwise in the first direction along the second path, a fifth linking segment having a thirteenth width across the fifth linking segment and having a thirteenth length that exceeds the thirteenth width, the fifth linking segment extending lengthwise in the second direction to couple the seventh segment to the eighth segment, a ninth segment having a fourteenth width across the ninth segment and having a fourteenth length that exceeds the fourteenth width, the ninth segment extending lengthwise in the first direction along the third path, and a sixth linking segment having a fifteenth width across the sixth linking segment and having a fifteenth length that exceeds the fifteenth width, the sixth linking segment extending lengthwise in the second direction to couple the eighth segment to the ninth segment, and wherein the third conductive line is electrically isolated from each of the first and second conductive lines.

7. The assembly of claim 6, wherein each of the first and second conductive lines is configured to serve as a shield line and the third conductive line is configured to serve as a signal line.

8. The assembly of claim 1, wherein the fifth segment of the second conductive line further includes a third portion overlapping with a fourth portion of the third segment of the first conductive line, and wherein the assembly further comprises a second vertical interconnect between the first and second conductive lines to couple the third portion of the fifth segment of the second conductive line to the fourth portion of the third segment of the first conductive line.

9. The assembly of claim 8, wherein each of the first and second conductive lines is supplied with a power voltage.

10. The assembly of claim 9, wherein the power voltage is Vss.

11. The assembly of claim 9, wherein the power voltage is Vdd.

12. An assembly comprising:
a first wiring level comprising a first shield line and a signal line, wherein the first shield line comprises a first segment having a first width across the first segment and having a first length that exceeds the first width, the first segment extending lengthwise in a first direction, a second segment having a second width across the second segment and having a second length that exceeds the second width, the second segment extending lengthwise in the first direction and laterally offset from the first segment, a first linking segment having a third width across the first linking segment and having a third length that exceeds the third width, the third segment extending lengthwise in a second direction crossing the first direction to couple the first and second segments to each other, a third segment having a fourth width across the third segment and having a fourth length that exceeds the fourth width, the third segment extending lengthwise in the first direction and laterally offset from the second segment, and a second linking segment having a fifth width across the second linking segment and having a fifth length that exceeds the fifth width, the second linking segment extending lengthwise in the second direction to couple the second and third segments to each other, and wherein signal line comprises a fourth segment, a fifth segment, a third linking segment, a sixth segment and a fourth linking segment that are substantially parallel to the first segment, the second segment, the first linking segment, the third segment and the second linking segment of the first shield line, respectively;

a second wiring level below the first wiring level and comprising a second shield line, wherein the second shield line comprises a seventh segment having a sixth width across the seventh segment and having a sixth length that exceeds the sixth width, the seventh segment extending lengthwise in the first direction, an eighth segment having a seventh width across the eighth segment and having a seventh length that exceeds the seventh width, the eighth segment extending lengthwise in the first direction and laterally offset from the seventh segment, a fifth linking segment having an eighth width across the fifth linking segment and having an eighth length that exceeds the eighth width, the fifth linking segment extending lengthwise in the second direction to couple the seventh and eighth segments to each other, a ninth segment having a ninth width across the ninth segment and having a ninth length that exceeds the ninth width, the ninth segment extending lengthwise in the first direction and laterally offset from the eighth segment, and a sixth linking segment having a tenth width across the sixth linking segment and having a tenth length that exceeds the tenth width, the sixth linking segment extending lengthwise in the second direction to couple the eighth segment to the ninth segment, and wherein the eighth segment includes a portion that overlaps a portion of the first segment of the first shield line; and a first vertical interconnection coupling the portion of the first segment of the first shield line to the portion of the eighth segment of the second shield line.

13. The assembly of claim 12, wherein the first and third segments of the first shield line and the eighth segment of the second shield line are arranged in line along a first path, wherein the seventh and ninth segments of the second shield line are arranged in line along a second path, and wherein the second path is laterally offset from the first path.

14. The assembly of claim 13, wherein the eighth segment of the second shield line is terminated between the first and third segments of the first shield line.

15. The assembly of claim 14, further comprising dielectric material isolating the first wiring level from the second wiring level,
wherein the first vertical interconnection penetrates through the dielectric material to couple the portion of the first segment of the first shield line to the portion of the eighth segment of the second shield line.

16. The assembly of claim 13, wherein the eighth segment further includes another portion that overlaps a portion of the third segment of the first shield line; and
wherein the assembly further comprises a second vertical interconnection coupling the portion of the third segment of the first shield line to the another portion of the eighth segment of the second shield line.

17. The assembly of claim 16, further comprising dielectric material isolating the first wiring level from the second wiring level,
wherein the first vertical interconnection penetrates through the dielectric material to couple the portion of the first segment of the first shield line to the portion of the eighth segment of the second shield line; and
wherein the second vertical interconnection penetrates through the dielectric material to couple the portion of the third segment of the first shield line to the another portion of the eighth segment of the second shield line.

18. The assembly of claim 17, wherein the second shield line is configured to be supplied with a shield voltage so that the first shield line receives the shield voltage through the first and second vertical interconnections.

* * * * *